(12) United States Patent
Inoue et al.

(10) Patent No.: US 9,068,117 B2
(45) Date of Patent: Jun. 30, 2015

(54) PHOSPHOR MATERIAL AND LIGHT-EMITTING DEVICE

(71) Applicant: Panasonic Intellectual Property Management Co., Ltd., Osaka (JP)

(72) Inventors: Osamu Inoue, Osaka (JP); Kojiro Okuyama, Nara (JP); Mitsuru Nitta, Osaka (JP); Seigo Shiraishi, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/553,024

(22) Filed: Nov. 25, 2014

(65) Prior Publication Data

US 2015/0152327 A1  Jun. 4, 2015

(30) Foreign Application Priority Data

Dec. 3, 2013  (JP) .................. 2013-249803

(51) Int. Cl.
*H01L 29/22* (2006.01)
*C09K 11/77* (2006.01)
*H01L 33/50* (2010.01)

(52) U.S. Cl.
CPC .......... *C09K 11/7794* (2013.01); *H01L 33/502* (2013.01)

(58) Field of Classification Search
CPC .......................... H01L 33/502; C09K 11/7794
USPC .................................. 257/98, 101, 102, 103
See application file for complete search history.

(56) References Cited

U.S. PATENT DOCUMENTS

| 7,935,975 | B2 * | 5/2011 | Ishii et al. ...................... 257/98 |
| 8,716,731 | B2 * | 5/2014 | Yeh et al. ........................ 257/98 |
| 8,987,764 | B2 * | 3/2015 | Tomizawa et al. .............. 257/98 |
| 2008/0001122 | A1 | 1/2008 | Odaki et al. |
| 2010/0181585 | A1 | 7/2010 | Juestel et al. |
| 2010/0244066 | A1 | 9/2010 | Chiu et al. |

FOREIGN PATENT DOCUMENTS

| JP | 2005-008843 | 1/2005 |
| JP | 2005-054159 | 3/2005 |
| JP | 2007-254517 | 10/2007 |
| JP | 2008-007644 | 1/2008 |
| JP | 2010-521805 | 6/2010 |
| JP | 2010-229388 | 10/2010 |
| JP | 2010-248645 | 11/2010 |

* cited by examiner

*Primary Examiner* — Hung Vu
(74) *Attorney, Agent, or Firm* — McDermott Will & Emery LLP

(57) ABSTRACT

A phosphor material according to an embodiment of the present disclosure contains a major component represented by the formula $A_{2-v-w-x-y}B_v Ln_w Eu_x Sm_y M_{2-z} D_z O_8$, where A is one or more elements selected from the group consisting of alkaline-earth metal elements; B is one or more elements selected from the group consisting of alkali metal elements; Ln is one or more elements selected from the group consisting of rare-earth elements other than Eu and Sm; M is one or more elements selected from the group consisting of W and Mo; D is one or more elements selected from the group consisting of Nb and Ta; and v, w, x, y, and z satisfy the inequalities $0 \leq v \leq 0.5$, $0.15 \leq x+y \leq 0.7$, $0 \leq y \leq 0.05$, and $0 < z \leq 1.7$ and the equation $w+x+y=v+z$.

7 Claims, 4 Drawing Sheets

PHOSPHOR MATERIAL AND LIGHT-EMITTING DEVICE

CROSS REFERENCES TO RELATED APPLICATIONS

This Application claims priority to Japanese Patent Application No. 2013-249803, filed on Dec. 3, 2013, the contents of which are hereby incorporated by reference.

BACKGROUND

1. Technical Field

The present disclosure relates to a phosphor material which is combined with a light-emitting device such as a light-emitting diode (hereinafter referred to as "LED") and a semiconductor laser diode (hereinafter referred to as "LD") and which can be used in a light-emitting device such as a projector light source, a vehicle headlamp light source, and a white LED illumination light source. Furthermore, the present disclosure relates to a light-emitting device including the phosphor material.

2. Description of the Related Art

A illumination system including a white LED has higher efficiency and longer life as compared to a conventional illumination system and is widely used for business and home from the viewpoint of resource-saving and energy-saving.

In the most common white LED, a blue LED chip and a phosphor that absorbs a portion of blue light to emit yellow light are used and pseudo-white light is obtained by mixing blue light and yellow light, which is complementary thereto. However, the following LED is under development because color rendering properties, color reproducibility, and the like are required: a white LED including a combination of a blue LED chip, a green phosphor, and a red phosphor or a combination of a LED chip with a wavelength range from near-ultraviolet to blue-violet and three kinds of phosphors, that is, a blue phosphor, a green phosphor, and a red phosphor.

In applications, such as a projector light source and a vehicle headlamp light source, required to have high emission energy, a light source including a combination of an LD with a wavelength range from near-ultraviolet to blue-violet and a phosphor is under development.

A phosphor given by the compositional formula $Ca_{2-2x}Li_xEu_xW_2O_8$ or the like is known as a red phosphor which can be excited in a wavelength range from near-ultraviolet to blue and which has an $Eu^{3+}$ luminescent center to emit light in the red region as disclosed in, for example, Japanese Unexamined Patent Application Publication Nos. 2007-254517, 2008-7644, and 2010-229388.

However, conventional red phosphors do not have sufficient luminous efficiency. Temperature characteristics thereof have not been taken into account. Therefore, there is a big problem in that the ambient temperature of a phosphor used is likely to rise particularly in a high emission energy region.

SUMMARY

An embodiment of the present disclosure provides a phosphor material which has high conversion efficiency and in which the temperature dependence of luminance is high at high temperature. An embodiment of the present disclosure provides a light-emitting device with high efficiency.

A phosphor material according to an embodiment of the present disclosure contains a major component represented by the formula $A_{2-v-w-x-y}B_vLn_wEu_xSm_yM_{2-z}D_zO_8$, where A is one or more elements selected from the group consisting of alkaline-earth metal elements; B is one or more elements selected from the group consisting of alkali metal elements; Ln is one or more elements selected from the group consisting of rare-earth elements other than Eu and Sm; M is one or more elements selected from the group consisting of W and Mo; D is one or more elements selected from the group consisting of Nb and Ta; and v, w, x, y, and z satisfy the inequalities $0 \leq v \leq 0.5$, $0.15 \leq x+y \leq 0.7$, $0 \leq y \leq 0.05$, and $0 < z \leq 1.7$ and the equation $w+x+y=v+z$.

According to an embodiment of the present disclosure, a phosphor material having high luminous efficiency and excellent temperature characteristics is provided. A light-emitting device including the phosphor material exhibits high efficiency under high-temperature, high-energy conditions.

DETAILED DESCRIPTION

Figure 1:
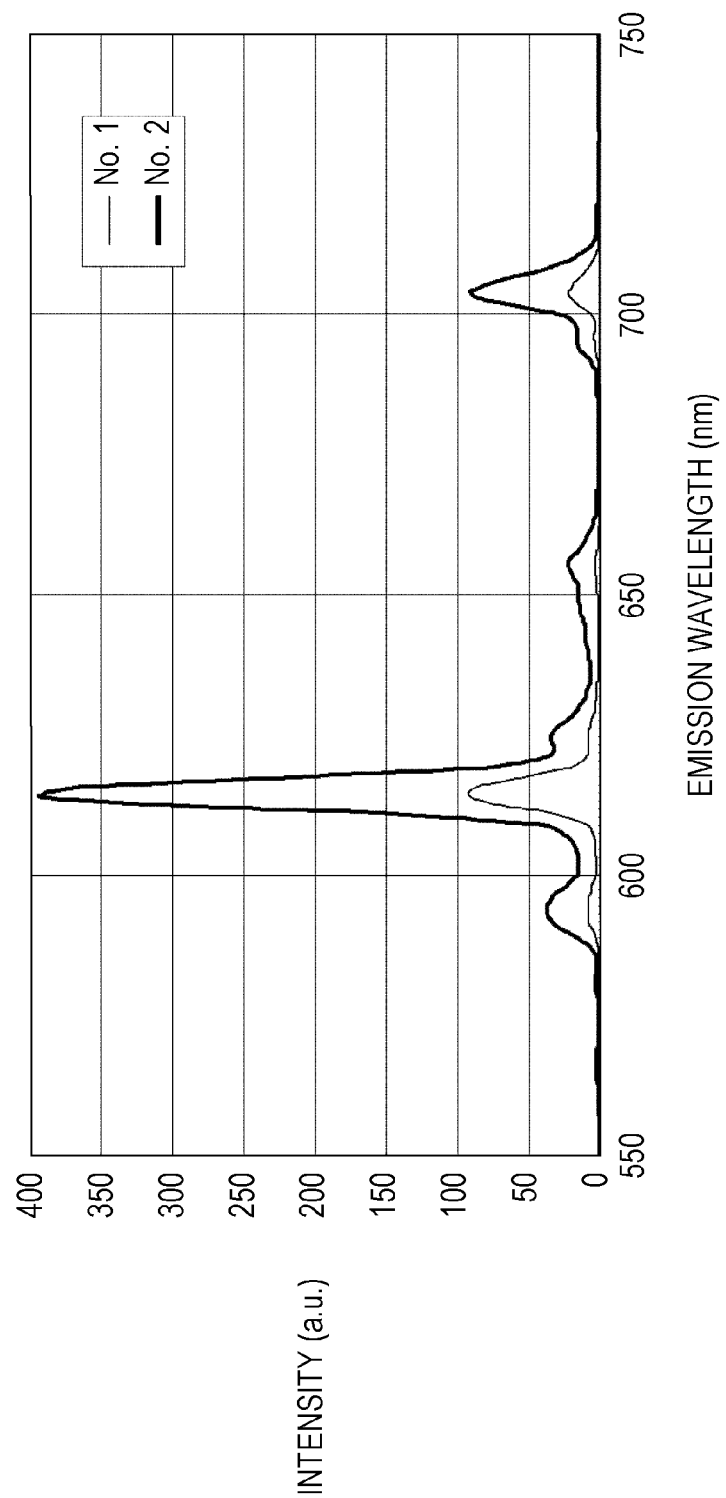
FIG. 1 is a graph showing the emission spectrum of a phosphor material according to an example.

The present disclosure will now be described in detail with reference to embodiments. The present disclosure is not limited to the embodiments. Modifications can be made without departing from the technical scope of the present disclosure.

First Embodiment

A phosphor material according to a first embodiment of the present disclosure contains a major component represented by the formula $A_{2-v-w-x-y}B_vLn_wEu_xSm_yM_{2-z}D_zO_8$, where A is one or more elements selected from the group consisting of alkaline-earth metal elements; B is one or more elements selected from the group consisting of alkali metal elements; Ln is one or more elements selected from the group consisting of rare-earth elements other than Eu and Sm; M is one or more elements selected from the group consisting of W and Mo; D is one or more elements selected from the group consisting of Nb and Ta; and v, w, x, y, and z satisfy the inequalities $0 \leq v \leq 0.5$, $0.15 \leq x+y \leq 0.7$, $0 \leq y \leq 0.05$, and $0 < z \leq 1.7$ and the equation $w+x+y=v+z$.

The weight ratio of the major component to the phosphor material may be 90% or more. Alternatively, the weight ratio of the major component to the phosphor material may be 95% or more.

The phosphor material according to this embodiment has an emission spectrum with a peak wavelength of, for example, 580 nm to 750 nm. Alternatively, the phosphor material according to this embodiment has an emission spectrum with a peak wavelength of, for example, 600 nm to 700 nm.

The base material of the phosphor material according to this embodiment is $A_2M_2O_8$ (for example, $CaWO_4$). In order to convert $A_2M_2O_8$ into a phosphor, atomic sites of a divalent element A need to be partly replaced with trivalent europium (Eu), which is a luminescent center. However, partial replacement only causes electroneutrality to be collapse. An earlier document describes $Ca_{2-2x}Li_xEu_xW_2O_8$, in which in order to maintain electroneutrality, a monovalent alkali metal element $B^+$ is used, a molar of the monovalent alkali metal element $B^+$ is equivalent to a molar of $Eu^{3+}$, and an alkaline-earth metal element A is replaced with the alkali metal element $B^+$ and $Eu^{3+}$. However, this composition cannot achieve sufficient luminous efficiency.

In this embodiment, charge compensation is performed by replacing an atomic site of a hexavalent element M with a tetravalent element D. In this case, an atomic site of an alkaline-earth metal element A may be replaced with an alkali metal element B. A mechanism to improve luminous efficiency in this embodiment is unclear. In the case of performing charge compensation using an alkali metal element only, the melting point of a produced compound is low and therefore reaction temperature cannot be raised. However, replacement with the tetravalent element D increases the melting point and reaction temperature can be raised. Therefore, a compound with good crystallinity can be obtained. This probably results in an improvement in luminous efficiency.

In this embodiment, the use of $Sm^{3+}$ (samarium) together with $Eu^{3+}$ enables excitation at a wavelength of 405 nm, which is difficult for $Eu^{3+}$ only.

Furthermore, for example, another trivalent rare-earth element other than Eu and Sm Ln can be used. In the case of using the rare-earth element Ln other than Eu and Sm, charge compensation for these elements is necessary. Therefore, the total amount (total atomic percent) of Eu, Sm, and Ln needs to be equal to the total amount (total atomic percent) of the alkali metal element B and the tetravalent element D. The use of the rare-earth element Ln allows the amount of the tetravalent element D to be increased, leading to an increase in melting point. This results in that reaction temperature can be raised and luminous efficiency is increased. Increases in amounts of Eu and Sm allow the amount of the tetravalent element D to be increased alike. However, the excessive increase in amount of Eu deteriorates temperature characteristics and the excessive increase in amount of Sm reduces luminous efficiency. The use of the rare-earth element Ln other than Eu and Sm allows temperature characteristics and luminous efficiency to be increased.

In this embodiment, one or more alkaline-earth metal elements may be used as the element A. The use of calcium (Ca) as the element A significantly increases luminous efficiency as compared to the use of another alkaline-earth metal element. One or more alkaline-earth metal elements selected from the group consisting of magnesium (Mg), strontium (Sr), and barium (Ba) may be partly used in addition to Ca. In this case, when Ca is dominant, temperature characteristics and luminous efficiency can be increased. The term "dominant" as used herein means 70 atomic percent or more and preferably 90 atomic percent or more.

One or more alkali metal elements may be used as the element B. The use of at least one of lithium (Li) and sodium (Na) allows luminous efficiency to be most increased. Cesium (Cs), rubidium (Rb), and potassium (K) can achieve high luminous efficiency in that order except Li and Na. In particular, Li, Na, and K are more chemically stable, are easier to handle, and are inexpensive than Rb and Cs. Thus, the use of one or more alkali metal elements selected from the group consisting of Li, Na, and K as the element B allows the ease of producing the phosphor material to be increased and also allows production costs thereof to be reduced.

One or more rare-earth elements other than Eu and Sm may be used as the element Ln. The luminous efficiency of the phosphor material is highest when gadolinium (Gd), which is a rare-earth element with an ionic radius close to that of $Eu^{3+}$, is used as the element Ln, followed by yttrium (Y) and lutetium (Lu). On the other hand, Y, lanthanum (La), and Gd are inexpensive. Thus, the use of at least one of Y, La, and Gd allows luminous efficiency to be increased and also allows costs to be reduced.

At least one of tungsten (W) and molybdenum (Mo) can be used as an element M. W is unlikely to sublimate as compared to Mo and therefore is readily used for production. Thus, the use of W as the element M allows the ease of producing the phosphor material to be increased. Furthermore, the use of W as the element M increases luminous efficiency and temperature characteristics as compared to the use of Mo as the element M. In the case of using W and Mo in combination, the ease of producing the phosphor material, the luminous efficiency thereof, and temperature characteristics thereof can be increased.

At least one of Nb and Ta can be used as an element D. The use of Nb is likely to increase luminous efficiency as compared to the use of Ta.

In the formula $A_{2-v-w-x-y}B_vLn_wEu_xSm_yM_{2-z}D_zO_8$, v, w, x, y, and z satisfy the inequalities $0 \le v \le 0.5$, $0.15 \le x+y \le 0.7$, $0 \le y \le 0.05$, and $0 < z \le 1.7$ and the equation $w+x+y=v+z$. This can increase at least one of luminous efficiency and temperature characteristics as compared to composition ratio other than this. The term "composition ratio" as used herein refers to the proportion of atoms. Furthermore, at least one of luminous efficiency and temperature characteristics can be further increased in such a manner that the phosphor material is prepared such that v and z satisfy the inequalities $0 < v \le 0.33$ and $0.5 \le z \le 1.5$, respectively.

Sm need not be added. The addition of Sm allows LED and LD which are readily available and which emit light with a wavelength of 405 nm to be used. That is, the phosphor material may be prepared such that y satisfies the inequality $0 < y$. In the case of using LED and LD emitting light with a wavelength of 405 nm, the phosphor material is prepared such that, for example, y satisfies the inequality $0.01 \le y \le 0.05$.

The phosphor material according to this embodiment may contain 0.1% to 1.0% by weight (weight percent) of one or more elements selected from the group consisting of $Li_2O$, $Na_2O$, $K_2O$, LiF, $MgF_2$, and $ZnF_2$ as one or more minor components. The addition of these minor components allows luminous efficiency to be further increased. In the case of using, for example, Li as the element B and $Li_2O$ as an additive, Li is contained in an amount larger than the amount essentially necessary for the compositional formula.

Furthermore, the phosphor material according to this embodiment may be a sintered body obtained by molding and sintering powder. When the phosphor material according to this embodiment is the sintered body, the influence of scattering light is reduced and excitation light absorptance is increased, whereby luminous efficiency is improved. When the phosphor material according to this embodiment is the sintered body and has a small thickness, excitation light can partially pass through the phosphor material. When the phosphor material is the sintered body, excitation light can be reflected by the phosphor material. In this case, the density of the sintered body may be, for example, 5.5 g/cm³ or more. Alternatively, the density thereof may be 6.0 g/cm³ or more. The increase in density of the sintered body allows luminous efficiency to be sufficiently raised and also allows light transmittance to be increased.

When the phosphor material according to this embodiment is the sintered body, the minor components have the effect of promoting the densification thereof and can further improve the luminous efficiency thereof. In particular, when the phosphor material according to this embodiment is the sintered body and contains $Li_2O$ or $Na_2O$, extremely high luminous efficiency can be achieved.

The phosphor material according to this embodiment may contain a small amount of an oxide component other than those described above unless properties thereof are impaired. When the composition ratio deviates slightly, unnecessary component is contained. This is not problematic if the amount thereof is small and characteristics are not impaired.

A method for producing the phosphor material according to this embodiment is described below. A solid-phase method, a liquid-phase method, and a vapor-phase method can be used to produce the phosphor material. The solid-phase method is one in which raw material powders (metal oxides, metal carbonates, and the like) each containing a corresponding metal are mixed, are heat-treated at a temperature not lower than a certain level, and are subjected to reaction.

The liquid-phase method is one in which a solution containing metals is prepared and a solid is precipitated from the solution or is obtained in such a manner that the solution is applied to a substrate, is dried, and is then heat-treated at a temperature not lower than a certain level. The vapor-phase method is one in which a filmy solid is obtained by a process such as evaporation, sputtering, or chemical vapor deposition (CVD). The phosphor material is usually used in the form of powder. Therefore, in the case of forming the phosphor material into the sintered body, the use of the solid-phase method allows costs to be reduced.

Raw materials used in the solid-phase method may be, for example, powders of common raw materials such as oxides and carbonates. The raw material powders are mixed by means of, for example, a ball mill or the like and may be heat-treated in an ordinary electric furnace for reaction. An atmosphere for heat treatment may be an inert gas atmosphere such as an $N_2$ gas atmosphere or may be usually the atmosphere because Eu emits light when being trivalent.

In the case of preparing the sintered body, the raw material powders are directly molded and may be sintered or a powder of a phosphor prepared by heat-treating mixed powders of raw materials in advance is molded and may be sintered. In the case of preparing the sintered body from the phosphor powder, the phosphor powder is prepared by heat-treating the mixed raw material powders without using an additive, such as $Li_2O$ or $Na_2O$, promoting sintering or without excessive mixing; is additionally mixed with an additive; is molded; and may be sintered. Molding may be sheet molding or the like and is preferably common die molding, whereas any process can be used.

The phosphor material according to this embodiment is an oxide-based material, may be heat-treated in the atmosphere, and therefore has an advantage that the phosphor material is readily produced at low cost. The phosphor material can be excited by light in a wavelength range from near-ultraviolet to blue, particularly light with a wavelength of 405 nm, and has high luminosity, a main emission peak at a wavelength of about 614 nm to 615 nm, and good temperature characteristics. Even in the case of using a high-power excitation source such as a laser diode, the luminance is unlikely to be reduced. Furthermore, the decay time is short (about 1 ms at an afterglow of $1/10$) as an $Eu^{3+}$ system.

The emission spectrum of the phosphor material according to this embodiment is hardly varied by temperature. Therefore, the temperature dependence of luminance is substantially equal to the retention rate of the number of photons.

Second Embodiment

A second embodiment of the present disclosure provides a light-emitting device including at least an excitation light source and a phosphor material that absorbs excitation light emitted from the excitation light source to emit light. The phosphor material used in this embodiment is that described in the first embodiment. A example of the light-emitting device includes a projector light source, a vehicle headlamp light source, or a white LED illumination light source. LED or a combination of LD and a phosphor is included in the light-emitting device.

The light-emitting device according to this embodiment further includes a semiconductor light-emitting element emitting light with a peak wavelength of, for example, 380 nm to 470 nm. The phosphor material absorbs a portion of the light emitted from the semiconductor light-emitting element to emit red light. In this embodiment, the semiconductor light-emitting element includes an emitting layer made of, for example, a gallium nitride-based compound semiconductor. The excitation spectrum of the phosphor material according to this embodiment may have a peak wavelength of more than 380 nm to less than 390 nm, more than 390 nm to less than 400 nm, more than 400 nm to less than 410 nm, more than 415 nm to less than 425 nm, or more than 460 nm to less than 470 nm. The phosphor material according to this embodiment has excitation spectrum peaks at, for example, about 385 nm, about 396 nm, about 405 nm, about 420 nm, and about 465 nm. Thus, the luminous efficiency of the light-emitting device can be increased by adjusting the emission wavelength of the semiconductor light-emitting element to any one of these wavelengths.

Figure 4:
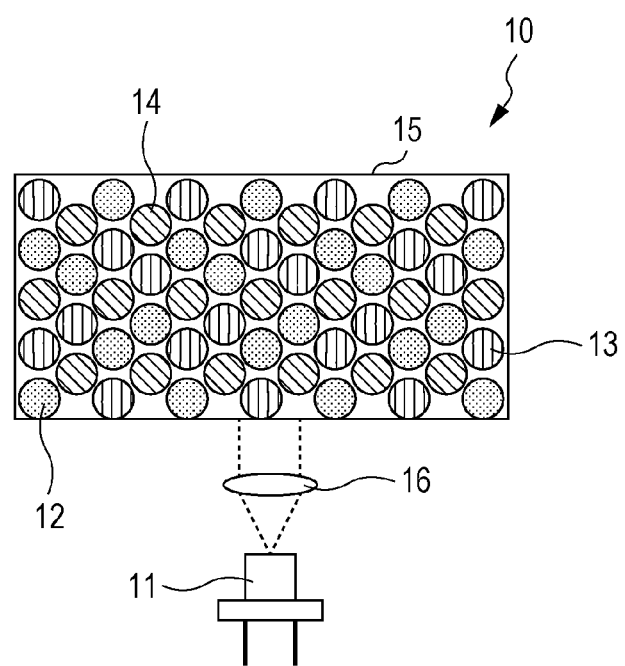
FIG. 4 is a schematic view of an example of a light-emitting device according to a second embodiment of the present disclosure.

FIG. 4 shows an example of a light-emitting device including an LD serving as an excitation light source. A light-emitting device 10 includes an LD 11 and a first phosphor material 12 that absorbs excitation light emitted from the LD 11 to emit light. The first phosphor material 12 is composed of a plurality of phosphor particles emitting red light (red phosphor). The light-emitting device 10 further includes a second phosphor material (green phosphor) 13 composed of a plurality of phosphor particles that absorb the excitation light emitted from the LD 11 to emit green light, a third phosphor material (blue phosphor) 14 composed of a plurality of phosphor particles that absorb the excitation light emitted from the LD 11 to emit blue light, a binder 15 placed between these phosphor particles, and an incident light system 16 introducing the excitation light emitted from the LD 11 to the first, second, and third phosphor materials 12, 13, and 14. The number of types of phosphor materials is not limited to three and may be one, two, or four or more.

In the case of applying this embodiment to a white LED, the white LED may be fabricated in such a manner that a blue LED chip is used as an excitation light source and is combined with the red and green phosphors used in this embodiment or a near-ultraviolet LED chip is used as an excitation light source and is combined with the red, blue, and green phosphors used in this embodiment. The configuration of the white LED and a method for fabricating the white LED are not particularly limited. The phosphor materials used in this embodiment may be used instead of, for example, known phosphor materials used to fabricate a white LED.

EXAMPLES

The present disclosure is further described below in detail with reference to examples and comparative examples. The present disclosure is not limited to the examples.

Example 1

Table 1 shows the compositions of Samples 1 and 2 which are examples of the present disclosure. In Example 1, each sample in Table 1 corresponds to its number and therefore, for example, Sample No. 1 is described as Sample 1. Incidentally, Samples 1 and 2 correspond to examples and therefore are described as "E" in the item "Judgment" in Table 1.

The compositions of Samples 1 and 2 are represented by the formula $A_{2-v-w-x-y}B_vLn_wEu_xSm_yM_{2-z}D_zO_8$. Elements shown in Table 1 were used as A, B, Ln, M, D, and an additive. Each value represents the composition ratio. Powders of $CaCO_3$, $Li_2CO_3$, $Gd_2O_3$, $Eu_2O_3$, $Sm_2O_3$, $WO_3$, and $Nb_2O_5$ corresponding to a special grade or higher grade chemical were used as starting materials to produce Samples 1 and 2. The raw material powders were weighed such that the composition ratio of each of Ca, Li, Gd, Eu, Sm, W, and Nb was as shown in Table 1. The weight obtained by subtracting the weight of $CO_2$ eliminated by firing from the total thereof was determined. $Li_2CO_3$ was excessively weighed such that the weight of $Li_2O$ was 0.3% by weight of the total weight. The raw material powders were wet-mixed in a ball mill using pure water as a medium, followed by drying at 120° C., whereby each mixed powder was obtained. The mixed powder was put in a crucible and was fired at 1,400° C. for 12 hours in the atmosphere, whereby a phosphor powder was obtained.

Figure 2:
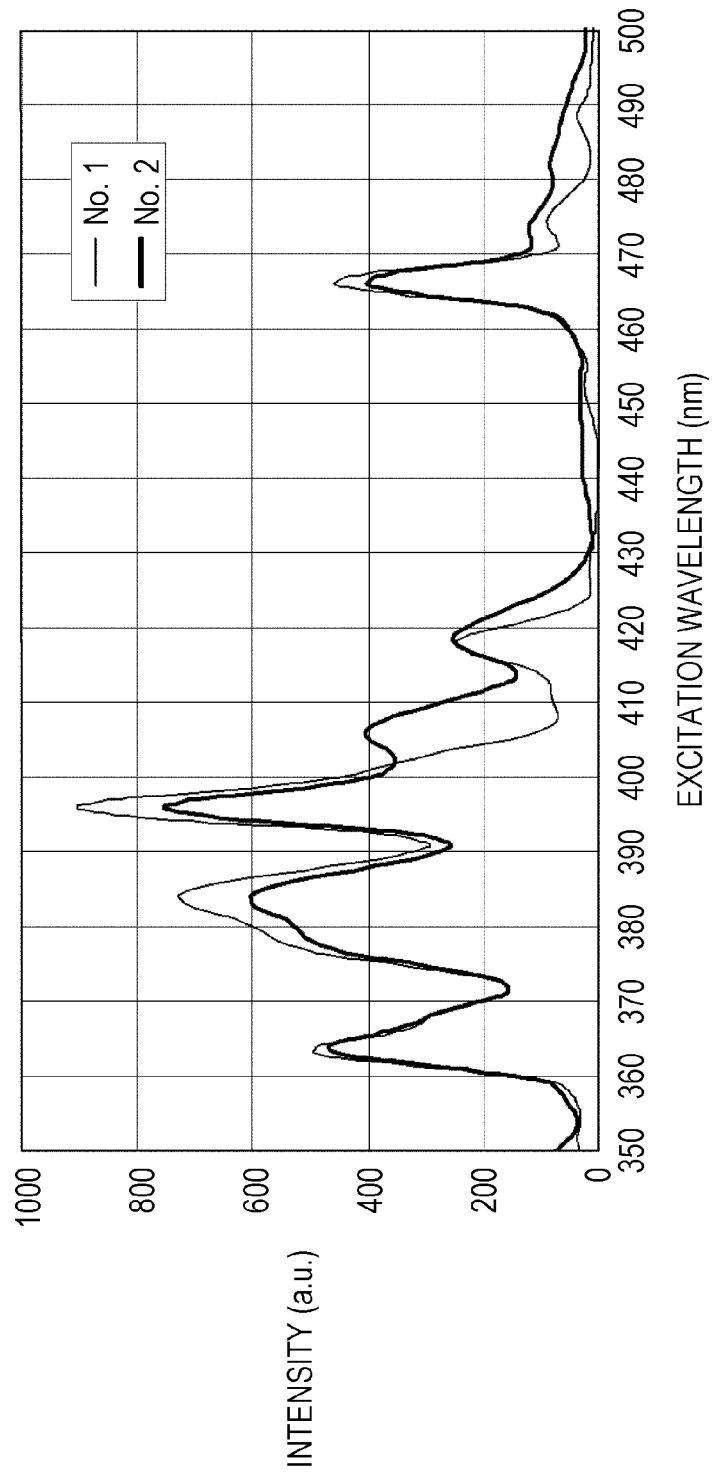
FIG. 2 is a graph showing the excitation spectrum of a phosphor material according to an example.
Figure 3:
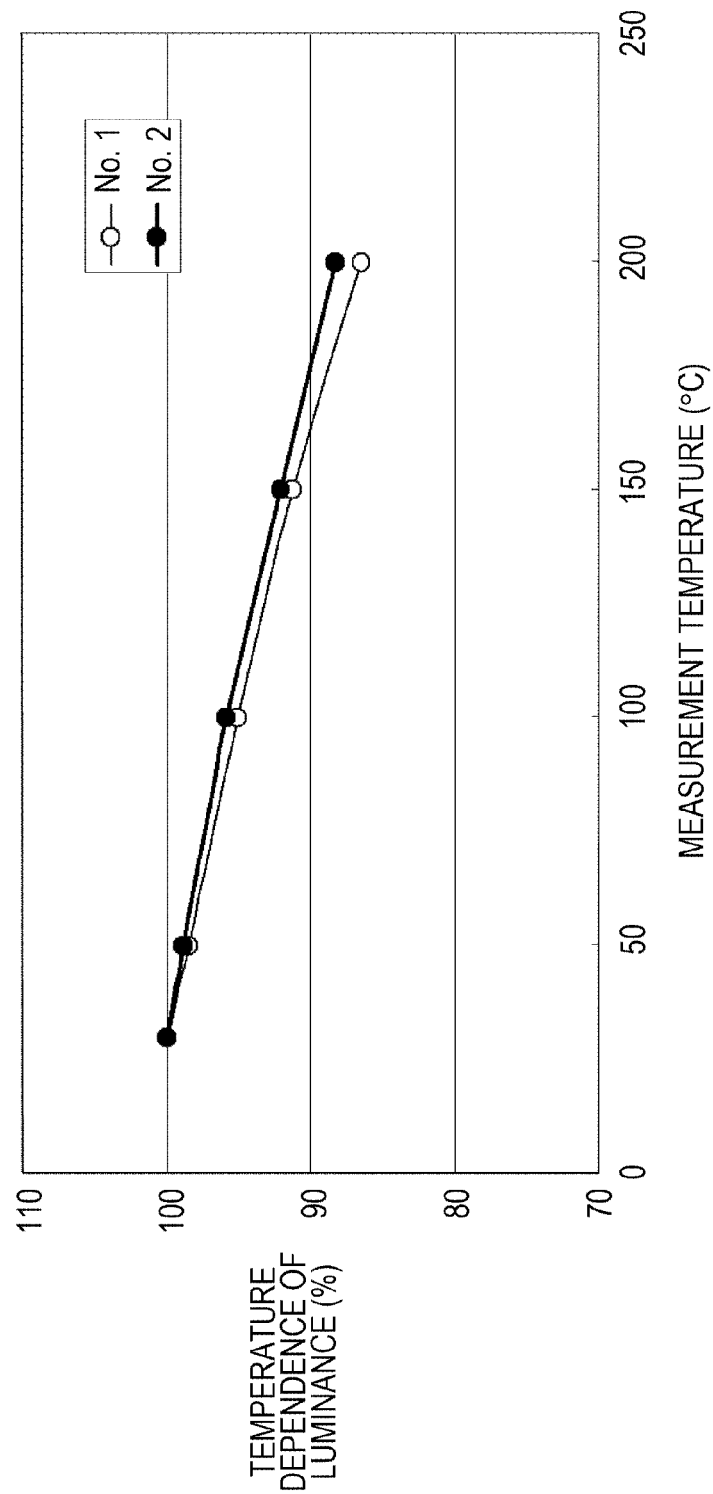
FIG. 3 is a graph showing the temperature dependence of luminance of a phosphor material according to an example.

Powders of Samples 1 and 2 were measured for emission spectrum from 550 nm to 750 nm using a JASCO FP-6500 spectrofluorometer under the following conditions: an excitation wavelength of 405 nm, an excitation bandwidth of 3 nm, an emission bandwidth of 1 nm, a data acquisition interval of 1 nm, and an operation speed of 500 nm/min. The measurement results are shown in FIG. 1. In FIG. 1, the ordinate represents the intensity, in arbitrary unit, of light emission and the abscissa represents the emission wavelength in nm. Furthermore, the excitation spectrum from 350 nm to 500 nm was measured at an emission wavelength of 615 nm under the following conditions: an excitation bandwidth of 3 nm, an emission bandwidth of 1 nm, a data acquisition interval of 1 nm, and an operation speed of 500 nm/min. The measurement results are shown in FIG. 2. In FIG. 2, the ordinate represents the intensity, in arbitrary unit, of light emission and the abscissa represents the excitation wavelength in nm. Sample 1 and Sample 2 were measured for luminance using excitation light with a wavelength of 396 nm and excitation light with a wavelength of 405 nm, respectively, in such a manner that the temperature of each sample was varied within the range of 30° C. to 200° C. In this measurement, the temperature dependence of luminance was determined at each temperature with respect to the luminance at 30° C. The measurement results are shown in FIG. 3. In FIG. 3, the ordinate represents the temperature dependence of luminance in percent and the abscissa represents the measurement temperature, in degrees Celsius, of each sample. Furthermore, Samples 1 and 2 were measured for internal quantum efficiency (IQE), excitation light absorptance (Abs.), and external quantum efficiency (EQE) equal to the product of the internal quantum efficiency and the excitation light absorptance at excitation wavelengths of 396 nm and 405 nm using a Hamamatsu Photonics C9920 absolute photoluminescence quantum yield measurement system. The measurement results are shown in Table 2.

The difference between the composition ratio of Sample 1 and the composition ratio of Sample 2 is the presence of Sm. As shown in FIG. 1, when being excited at a wavelength of 405 nm, Samples 1 and 2 exhibit substantially the same shaped emission spectrum and have a main emission peak at a wavelength of about 614 nm to 615 nm. That is, Samples 1 and 2 are red phosphors. However, the intensity of light emission of Sample 2 is far higher than the intensity of light emission of Sample 1.

As shown in FIG. 2, the emission spectrum of Sample 1, which contains no Sm, has peaks at wavelengths of about 385 nm, about 396 nm, about 420 nm, and about 465 nm. On the other hand, the emission spectrum of Sample 2 has a peak at a wavelength of about 405 nm to 406 nm in addition to these peaks.

As shown in Table 2, Sample 1 contains no Sm and the excitation light absorptance (Abs.) of Sample 1 excited at a wavelength of 405 nm is significantly less than that of Sample 1 excited at a wavelength of 396 nm. In contrast, Sample 2 contains Sm and the excitation light absorptance of Sample 2 excited at a wavelength of 405 nm is not so low; hence, Sample 2 can be efficiently excited with an LED chip or semiconductor laser emitting light with a wavelength of 405 nm. In the case of using excitation light with wavelengths of about 385 nm, about 396 nm, about 420 nm, and about 465 nm, the EQE of a phosphor material can probably be increased when the phosphor material has a composition containing no Sm like Sample 1. On the other hand, in the case where an excitation source which is readily available and which has a wavelength of 405 nm needs to be used, the EQE of a phosphor material can probably be increased when this phosphor material has a composition containing Sm like Sample 2.

As shown in FIG. 3 and Table 2, in a phosphor material of Sample 1 of this example, the temperature dependence of luminance is good, 91.2% at 150° C. and 86.5% at 200° C. with respect to the luminance at 30° C., in excitation at a wavelength of 396 nm. In a phosphor material of Sample 2 of this example, the temperature dependence of luminance is good, 92.1% at 150° C. and 88.3% at 200° C. with respect to the luminance at 30° C., in excitation at a wavelength of 405 nm.

TABLE 2

| Sample No. | Excitation wavelength | Luminous efficiency | | | Temperature dependence of luminance at 200° C. with respect to luminance at 30° C. |
|---|---|---|---|---|---|
| | | IQE | Abs. | EQE | |
| 1 | 396 nm | 91.8% | 30.7% | 28.2% | 86.5% |
| 1 | 405 nm | 79.6% | 6.6% | 5.3% | — |
| 2 | 396 nm | 89.7% | 30.4% | 27.3% | — |
| 2 | 405 nm | 79.7% | 23.9% | 19.0% | 88.3% |

TABLE 1

| No. | Composition ratio | | | | | | | Additive (weight percent) | Judgment |
|---|---|---|---|---|---|---|---|---|---|
| | A | B | Ln | Eu | Sm | M | D | | |
| 1 | Ca = 0.92 | Li = 0.08 | Gd = 0.67 | 0.33 | 0 | W = 1.08 | Nb = 0.92 | $Li_2O$ = 0.3 | E |
| 2 | Ca = 0.92 | Li = 0.08 | Gd = 0.67 | 0.31 | 0.02 | W = 1.08 | Nb = 0.92 | $Li_2O$ = 0.3 | E |

Example 2

Mixed powders were prepared in substantially the same manner as that described in Example 1 so as to meet the composition ratios of Samples 5 to 44 as shown in Table 3. In Example 2, as well as Example 1, each sample in Table 3 corresponds to its number and therefore, for example, Sample No. 5 is described as Sample 5.

Each mixed powder was press-molded using a die with a diameter of 20 mm, whereby a plurality of molded bodies were prepared. The molded bodies were fired, whereby sintered bodies having a diameter of about 14 mm and a thickness of about 0.85 mm were obtained. For each composition ratio, conditions for firing the molded bodies were varied, that is, the maximum holding temperature was varied from 900° C. to 1,500° C. in increments of 50° C. The molded bodies were fired at each temperature for 12 hours.

The sintered bodies were measured for internal quantum efficiency (IQE), excitation light absorptance (Abs.), and external quantum efficiency (EQE) equal to the product of the internal quantum efficiency and the excitation light absorptance at an excitation wavelength of 405 nm in substantially the same manner as that described in Example 1 using the Hamamatsu Photonics C9920 absolute photoluminescence quantum yield measurement system. For each composition ratio, evaluation results of a sample having the highest EQE at a firing temperature are shown in Table 3. Furthermore, samples having an EQE of more than 40% were measured for luminance by substantially the same method as that used in Example 1 in such a manner that the samples were excited by excitation light with a wavelength of 405 nm at 30° C. and 200° C., whereby the temperature dependence of luminance at 200° C. with respect to the luminance at 30° C. was determined.

Samples 3 and 4 that had the same compositions of Samples 1 and 2 which were phosphor powders prepared in Example 1 and that were sintered bodies were prepared and were evaluated similarly. The evaluation results are shown in Table 3.

Incidentally, samples corresponding to examples and samples corresponding to comparative examples are described as "E" and "C", respectively, in the item "Judgment" in Table 3.

TABLE 3

| No. | A | B | Ln | Eu | Sm | M | D | Additive (weight percent) | Firing temperature (° C.) | IQE | Abs. | EQE | Dependence (%) | Judgment |
|---|---|---|---|---|---|---|---|---|---|---|---|---|---|---|
| 1 | Ca = 0.92 | Li = 0.08 | Gd = 0.67 | 0.33 | — | W = 1.08 | Nb = 0.92 | Li$_2$O = 0.3 | 1400 | 79.6 | 6.6 | 5.3 | Unmeasured | E |
| 2 | Ca = 0.92 | Li = 0.08 | Gd = 0.67 | 0.31 | 0.02 | W = 1.08 | Nb = 0.92 | Li$_2$O = 0.3 | 1400 | 79.7 | 23.9 | 19.0 | 88.3 | E |
| 3 | Ca = 0.92 | Li = 0.08 | Gd = 0.67 | 0.33 | — | W = 1.08 | Nb = 0.92 | Li$_2$O = 0.3 | 1400 | 75.3 | 32.9 | 24.8 | Unmeasured | E |
| 4 | Ca = 0.92 | Li = 0.08 | Gd = 0.67 | 0.31 | 0.02 | W = 1.08 | Nb = 0.92 | Li$_2$O = 0.3 | 1400 | 70.7 | 77.9 | 54.8 | 89.4 | E |
| 5 | Ca = 1.34 | Li = 0.33 | — | 0.31 | 0.02 | W = 2.00 | — | Li$_2$O = 0.3 | 1000 | 71.1 | 59.6 | 42.4 | 90.6 | C |
| 6 | Ca = 1.17 | Li = 0.33 | Gd = 0.17 | 0.31 | 0.02 | W = 1.83 | Nb = 0.17 | Li$_2$O = 0.3 | 1000 | 69.5 | 68.9 | 47.9 | 90.3 | E |
| 7 | Ca = 1.01 | Li = 0.33 | Gd = 0.33 | 0.31 | 0.02 | W = 1.67 | Nb = 0.33 | Li$_2$O = 0.3 | 1050 | 71.5 | 72.3 | 51.7 | 90.1 | E |
| 8 | Ca = 0.68 | Li = 0.66 | Gd = 0.33 | 0.31 | 0.02 | W = 2.00 | — | Li$_2$O = 0.3 | 950 | 71.7 | 60.5 | 43.4 | 91.0 | C |
| 9 | Ca = 0.84 | Li = 0.50 | Gd = 0.33 | 0.31 | 0.02 | W = 1.84 | Nb = 0.16 | Li$_2$O = 0.3 | 1000 | 69.9 | 68.4 | 47.8 | 90.5 | E |
| 10 | Ca = 1.18 | Li = 0.16 | Gd = 0.33 | 0.31 | 0.02 | W = 1.50 | Nb = 0.50 | Li$_2$O = 0.3 | 1200 | 68.2 | 74.4 | 50.7 | 89.7 | E |
| 11 | Ca = 1.26 | Li = 0.08 | Gd = 0.33 | 0.31 | 0.02 | W = 1.42 | Nb = 0.58 | Li$_2$O = 0.3 | 1300 | 67.6 | 75.4 | 51.0 | 88.2 | E |
| 12 | Ca = 1.34 | — | Gd = 0.33 | 0.31 | 0.02 | W = 1.34 | Nb = 0.66 | Li$_2$O = 0.3 | 1300 | 66.4 | 68.7 | 45.6 | 87.6 | E |
| 13 | Ca = 1.42 | Li = 0.08 | Gd = 0.17 | 0.31 | 0.02 | W = 1.58 | Nb = 0.42 | Li$_2$O = 0.3 | 1100 | 64.2 | 73.3 | 47.1 | 87.8 | E |
| 14 | Ca = 1.09 | Li = 0.08 | Gd = 0.50 | 0.31 | 0.02 | W = 1.25 | Nb = 0.75 | Li$_2$O = 0.3 | 1400 | 71.3 | 73.1 | 52.1 | 89.7 | E |
| 15 | Ca = 0.76 | Li = 0.08 | Gd = 0.83 | 0.31 | 0.02 | W = 0.92 | Nb = 1.08 | Li$_2$O = 0.3 | 1450 | 70.7 | 76.2 | 53.9 | 88.4 | E |
| 16 | Ca = 0.26 | Li = 0.08 | Gd = 1.33 | 0.31 | 0.02 | W = 0.42 | Nb = 1.58 | Li$_2$O = 0.3 | 1450 | 68.6 | 71.9 | 49.3 | 86.2 | E |
| 17 | — | Li = 0.08 | Gd = 1.59 | 0.31 | 0.02 | W = 0.16 | Nb = 1.84 | Li$_2$O = 0.3 | 1500 | 68.7 | 45.1 | 31.0 | Unmeasured | C |
| 18 | Ca = 1.17 | — | Gd = 0.50 | 0.31 | 0.02 | W = 1.17 | Nb = 0.83 | Li$_2$O = 0.3 | 1300 | 67.3 | 69.9 | 47.0 | 87.9 | E |
| 19 | Ca = 1.00 | — | Gd = 0.67 | 0.31 | 0.02 | W = 1.00 | Nb = 1.00 | Li$_2$O = 0.3 | 1450 | 69.1 | 72.2 | 49.9 | 88.3 | E |
| 20 | Ca = 1.00 | — | Gd = 0.67 | 0.31 | 0.02 | W = 1.00 | Nb = 1.00 | — | 1500 | 70.0 | 66.7 | 46.7 | 88.1 | E |
| 21 | Ca = 0.67 | — | Gd = 1.00 | 0.31 | 0.02 | W = 0.67 | Nb = 1.33 | Li$_2$O = 0.3 | 1500 | 69.5 | 71.2 | 49.5 | 87.9 | E |
| 22 | Ca = 0.34 | — | Gd = 1.33 | 0.31 | 0.02 | W = 0.34 | Nb = 1.66 | Li$_2$O = 0.3 | 1500 | 65.6 | 69.1 | 45.3 | 87.5 | E |
| 23 | — | — | Gd = 1.67 | 0.31 | 0.02 | — | Nb = 2.00 | Li$_2$O = 0.3 | 1500 | 58.0 | 46.9 | 27.2 | Unmeasured | C |
| 24 | Ca = 0.92 | Li = 0.08 | Gd = 1.00 | 0.08 | 0.02 | W = 1.08 | Nb = 0.92 | Li$_2$O = 0.3 | 1400 | 49.5 | 75.0 | 37.1 | Unmeasured | C |
| 25 | Ca = 0.92 | Li = 0.08 | Gd = 0.85 | 0.13 | 0.02 | W = 1.08 | Nb = 0.92 | Li$_2$O = 0.3 | 1400 | 62.6 | 74.4 | 46.6 | 91.0 | E |
| 26 | Ca = 0.92 | Li = 0.08 | Gd = 0.50 | 0.48 | 0.02 | W = 1.08 | Nb = 0.92 | Li$_2$O = 0.3 | 1400 | 71.8 | 78.4 | 56.3 | 86.3 | E |
| 27 | Ca = 0.92 | Li = 0.08 | Gd = 0.30 | 0.68 | 0.02 | W = 1.08 | Nb = 0.92 | Li$_2$O = 0.3 | 1400 | 69.0 | 77.7 | 53.6 | 80.5 | E |
| 28 | Ca = 0.92 | Li = 0.08 | Gd = 0.20 | 0.78 | 0.02 | W = 1.08 | Nb = 0.92 | Li$_2$O = 0.3 | 1400 | 57.0 | 75.3 | 42.9 | 74.7 | C |
| 29 | Ca = 0.92 | Li = 0.08 | Gd = 0.67 | 0.32 | 0.01 | W = 1.08 | Nb = 0.92 | Li$_2$O = 0.3 | 1400 | 75.8 | 65.0 | 49.3 | 89.0 | E |
| 30 | Ca = 0.92 | Li = 0.08 | Gd = 0.67 | 0.29 | 0.05 | W = 1.08 | Nb = 0.92 | Li$_2$O = 0.3 | 1400 | 58.6 | 78.1 | 45.8 | 88.9 | E |
| 31 | Ca = 0.92 | Li = 0.08 | Gd = 0.67 | 0.28 | 0.06 | W = 1.08 | Nb = 0.92 | Li$_2$O = 0.3 | 1400 | 39.9 | 78.4 | 31.3 | Unmeasured | C |
| 32 | Ca = 0.92 | Na = 0.08 | Gd = 0.67 | 0.31 | 0.02 | W = 1.08 | Nb = 0.92 | Na$_2$O = 0.3 | 1400 | 71.1 | 78.3 | 55.7 | 90.1 | E |
| 33 | Ca = 0.92 | K = 0.08 | Gd = 0.67 | 0.31 | 0.02 | W = 1.08 | Nb = 0.92 | K$_2$O = 0.3 | 1400 | 70.5 | 74.0 | 52.2 | 91.0 | E |
| 34 | Ca = 0.92 | Li = 0.08 | La = 0.67 | 0.31 | 0.02 | W = 1.08 | Nb = 0.92 | Li$_2$O = 0.3 | 1400 | 70.7 | 65.1 | 46.0 | 82.6 | E |
| 35 | Ca = 0.92 | Li = 0.08 | Y = 0.67 | 0.31 | 0.02 | W = 1.08 | Nb = 0.92 | Li$_2$O = 0.3 | 1400 | 71.8 | 71.3 | 51.2 | 87.5 | E |
| 36 | Ca = 0.92 | Li = 0.08 | Lu = 0.67 | 0.31 | 0.02 | W = 1.08 | Nb = 0.92 | Li$_2$O = 0.3 | 1400 | 72.1 | 69.1 | 49.8 | 85.6 | E |
| 37 | Ca = 0.92 | Li = 0.08 | Gd = 0.67 | 0.31 | 0.02 | W = 1.08 | Ta = 0.92 | Li$_2$O = 0.3 | 1500 | 69.7 | 70.7 | 49.3 | 86.4 | E |
| 38 | Ca = 0.92 | Li = 0.08 | Gd = 0.67 | 0.31 | 0.02 | W = 1.08 | Nb = 0.92 | — | 1450 | 71.0 | 72.3 | 51.3 | 88.8 | E |
| 39 | Ca = 0.92 | Li = 0.08 | Gd = 0.67 | 0.31 | 0.02 | W = 1.08 | Nb = 0.92 | Li$_2$O = 0.1 | 1400 | 70.8 | 75.4 | 53.4 | 89.0 | E |
| 40 | Ca = 0.92 | Li = 0.08 | Gd = 0.67 | 0.31 | 0.02 | W = 1.08 | Nb = 0.92 | Li$_2$O = 1.0 | 1400 | 70.3 | 76.8 | 54.0 | 89.3 | E |
| 41 | Ca = 0.92 | Li = 0.08 | Gd = 0.67 | 0.31 | 0.02 | W = 1.08 | Nb = 0.92 | Li$_2$O = 1.5 | 1400 | 69.5 | 71.4 | 49.6 | 88.9 | E |
| 42 | Ca = 0.92 | Li = 0.08 | Gd = 0.67 | 0.31 | 0.02 | W = 1.08 | Nb = 0.92 | Na$_2$O = 0.3 | 1400 | 70.1 | 77.5 | 54.3 | 89.5 | E |
| 43 | Ca = 0.92 | Li = 0.08 | Gd = 0.67 | 0.31 | 0.02 | W = 1.08 | Nb = 0.92 | K$_2$O = 0.3 | 1400 | 70.3 | 76.7 | 53.9 | 89.0 | E |
| 44 | Ca = 0.92 | Li = 0.08 | Gd = 0.67 | 0.31 | 0.02 | W = 1.08 | Nb = 0.92 | LiF = 0.3 | 1400 | 72.2 | 76.2 | 55.0 | 89.2 | E |
| 45 | Ca = 0.92 | Li = 0.08 | Gd = 0.67 | 0.31 | 0.02 | W = 1.08 | Nb = 0.92 | MgF$_2$ = 0.3 | 1400 | 70.7 | 76.7 | 54.2 | 88.7 | E |
| 46 | Ca = 0.92 | Li = 0.08 | Gd = 0.67 | 0.31 | 0.02 | W = 1.08 | Nb = 0.92 | ZnF$_2$ = 0.3 | 1400 | 70.4 | 76.0 | 53.5 | 88.3 | E |

As is clear from comparisons between Samples 1 and 2 and Samples 3 and 4 in Table 3, sintered bodies having the same composition ratio have slightly decreased IQE, significantly improved Abs., and therefore significantly improved EQE.

Samples 6 and 7 correspond to the case where, with respect to Sample 5 which is a comparative example and which contains none of an element Ln and an element D, the amount of Li used as an element B is constant and is the same as Sample 5, Gd is used as the element Ln, Nb is used as the element D, and the amounts of Gd and Nb are increased. In Samples 6 and 7, retention rate is hardly varied and EQE is increased with respect to Sample 5, which is a comparative example.

Samples 9, 7, 10, 11, and 12 correspond to the case where, with respect to Sample 8 which contains Gd as the element Ln and contains no D and which is a comparative example, the amount of Gd used as the element Ln is the same as Sample 8 and is constant, the amount of Li used as the element B is reduced, and the amount of Nb used as the element D is increased. When the amount of Li is reduced and the amount of Nb is increased, EQE increases once and then decreases. In Sample 12 which contains no Li as the element B, EQE is higher than Sample 8, which is a comparative example.

Samples 13, 11, 14, 4, 15, and 16 and Sample 17 which is a comparative example correspond to the case where the amount of Li used as the element B is 0.08 and is constant and the amount of Gd used as the element Ln and the amount of Nb used as the element D are increased together. When the amounts of Gd and Nb are increased, EQE increases once. However, when the amounts of Gd and Nb are excessively increased, EQE decreases and the temperature dependence of luminance decreases gradually.

Samples 12, 18, 19, 21, and 22 and Sample 23 which is a comparative example correspond to the case where the amount of the element B is 0 and the amount of Gd used as the element Ln and the amount of Nb used as the element D are increased together. In this case, when the amounts of Gd and Nb are increased, EQE increases once. However, when the amounts of Gd and Nb are excessively increased, EQE decreases. Incidentally, Sample 20 has the same composition ratio as that of Sample 19 and corresponds to the case where $Li_2O$ which is an additive is not used (that is, the case where no alkali metal is contained). This case is slightly inferior to Sample 19 and exhibits high EQE.

As to z which represents the amount of the element D, according to the above results and further investigations made by the inventors, when the amount of Nb used as the element D is more than 1.7, EQE is lower than that of Samples 5 and 8 which contain no Nb and which are comparative examples. Thus, the upper limit of the amount of Nb, that is, the upper limit of z is 1.7 and may be more preferably 1.5 or less. For the lower limit of the amount of Nb, that is, the lower limit of z, although there is an effect even when z is slightly more than 0, EQE is likely to be high when z is 0.5 or more.

According to the above results and further investigations made by the inventors, v which represents the amount of the element B may be 0. When the amount of Li used as the element B is more than 0, higher EQE is obtained. On the other hand, when the amount of Li, that is, z is excessively large, EQE is unlikely to be high. Therefore, when z is 0.50 or less, particularly 0.33 or less, EQE is good.

Sample 24 which is a comparative example, Samples 25, 4, 26, and 27 which are examples, and Sample 28 which is a comparative example correspond to the case where the amounts of Li, Nb, and Sm are constant, the amount of Eu is increased, and the amount of Gd used as the element Ln is reduced. When the amount of Eu is increased, EQE increases once. However, when the amount of Eu is excessively increased, EQE decreases and the temperature dependence of luminance also decreases. According to the above results and further investigations made by the inventors, when the amounts of Eu and Sm, that is, x plus y is 0.15 or more, 0.2 or more, or 0.3 or more, EQE can be increased. In addition, when the amounts of Eu and Sm, that is, x plus y is 0.75 or less, 0.7 or less, or 0.65 or less, EQE can be increased. Samples 3, 29, 4, and 30 and Sample 31 which is a comparative example correspond to the case where the amounts of Li, Nb, and Gd are constant, the amount of Sm is increased, and the amount of Eu is reduced. When the amount of Sm is 0, EQE is low. This is due to excitation at a wavelength of 405 nm as described in Example 1. In the case of excitation at a wavelength of 396 nm, high EQE may possibly be achieved even when the amount of Sm is close to 0. In excitation at a wavelength of 405 nm, when the amount of Sm is increased, EQE increases. However, when the amount of Sm is excessively increased, IQE decreases even in excitation at a wavelength of 405 nm. As a result, EQE decreases. According to the above results and further investigations made by the inventors, when the amount of Sm, that is, y is 0 or more and 0.05 or less, EQE can be increased. Furthermore, when the amount of Sm, that is, y is 0.04 or less, EQE can be increased. In particular, in the case of excitation at a wavelength of 405 nm, when the amount of Sm, that is, y is 0.01 or more, EQE can be increased.

Samples 4, 32, and 33 are for comparison in the case where Li, Na, and K are used as alkali metals for the element B. Li and Na exhibit substantially equal EQE. K is lower in EQE than Li and Na and exhibits good characteristics.

Samples 4, 34, 35, and 36 are for comparison in the case where Gd, La, Y, and Lu are used as rare-earth metal elements other than Eu and Sm for element Ln. EQE is highest in the case of using Gd and decreases in the order of Y, Lu, and La.

Samples 4 and 37 are for comparison in the case where Nb and Ta are used as the element D. The use of Nb provides higher EQE.

Samples 38, 39, 4, 40, and 41 correspond to the case where the amount of $Li_2O$ used as an additive is increased. The addition of $Li_2O$ increases EQE. However, the excessive increase of added amount reduces EQE. According to the above results and further investigations made by the inventors, when the amount of $Li_2O$, that is, the additive is more than 0, EQE can be increased. When the amount (weight percent) of $Li_2O$, that is, the additive is more than 0.05, 0.1, or 0.2% by weight, EQE can be increased. Furthermore, when the amount (weight percent) of $Li_2O$, that is, the additive is less than 1.5, 1.3, or 1.0% by weight, EQE can be increased.

Samples 4, 42, 43, 44, 45, and 46 correspond to the case where $Li_2O$, $Na_2O$, $K_2O$, $LiF$, $MgF_2$, and $ZnF_2$ are used as additives. These samples have higher EQE as compared to Sample 38 which has the same material composition as that of these samples and which contains no additive; hence, the effect of adding these additives is recognized.

Example 3

A powder of Sample 2 of Example 1 was prepared. To a dimethyl silicone resin, 10% by weight of the powder thereof was added, followed by kneading through the use of a three-roll kneading machine, whereby an uncured phosphor resin mixture was obtained.

Next, an LED chip emitting light with a central wavelength of 405 nm was prepared. The LED chip was covered with the phosphor resin mixture and was then heated such that the resin was cured, whereby an LED device was completed. In the LED device, the LED chip was energized to emit light, which was recognized as red light by observation.

A phosphor material according to the present disclosure can be excited in a wavelength range from near-ultraviolet to blue, has high efficiency and excellent temperature characteristics, and therefore is useful for various applications. In particular, the phosphor material can be used in a projector light source, a vehicle headlamp light source, or a white LED illumination light source. A light-emitting diode or a combination of a semiconductor laser diode and a phosphor is included in the projector light source, the vehicle headlamp light source, or the white LED illumination light source.

What is claimed is:

1. A phosphor material containing a major component represented by the formula $A_{2-v-w-x-y}B_vLn_wEu_xSm_yM_{2-z}D_zO_8$, where A is one or more elements selected from the group consisting of alkaline-earth metal elements; B is one or more elements selected from the group consisting of alkali metal elements; Ln is one or more elements selected from the group consisting of rare-earth elements other than Eu and Sm; M is one or more elements selected from the group consisting of W and Mo; D is one or more elements selected from the group consisting of Nb and Ta; and v, w, x, y, and z satisfy the inequalities $0 \leq v \leq 0.5$, $0.15 \leq x+y \leq 0.7$, $0 \leq y \leq 0.05$, and $0 < z \leq 1.7$ and the equation $w+x+y=v+z$.

2. The phosphor material according to claim 1, further containing 0.1% to 1.0% by weight of one or more elements selected from the group consisting of $Li_2O$, $Na_2O$, $K_2O$, LiF, $MgF_2$, and $ZnF_2$ as one or more minor components.

3. The phosphor material according to claim 1, wherein v satisfies the inequalities $0 < v \leq 0.33$, and z satisfies the inequalities $0.5 \leq z \leq 1.5$.

4. The phosphor material according to claim 1, wherein y satisfies the inequality $0.01 \leq y \leq 0.05$.

5. The phosphor material according to claim 1, wherein A is Ca, B is one or more elements selected from the group consisting of Li and Na, Ln is one or more elements selected from the group consisting of Gd and Y, M is W, and D is Nb.

6. The phosphor material according to claim 1, being a sintered body.

7. A light-emitting device comprising:
an excitation light source; and
the phosphor material according to claim 1, wherein the phosphor material absorbs excitation light emitted from the excitation light source to emit light.

* * * * *